(12) United States Patent
Banerjee et al.

(10) Patent No.: US 11,774,868 B2
(45) Date of Patent: Oct. 3, 2023

(54) IMAGE SENSOR FOR IMMERSION LITHOGRAPHY

(71) Applicant: ASML NETHERLANDS B.V., Veldhoven (NL)

(72) Inventors: Nirupam Banerjee, Eindhoven (NL); Johan Franciscus Maria Beckers, Veldhoven (NL); Peter Brakhage, Dresden (DE); Arend Johannes Donkerbroek, Aarle-Rixtel (NL); Daniel Grimm, Dresden (DE); Tim Rathje, Jena (DE); Martin Tilke, Steina (DE); Sandro Wricke, Nuenen (NL)

(73) Assignee: ASML NETHERLANDS B.V., Veldhoven (NL)

( * ) Notice: Subject to any disclaimer, the term of this patent is extended or adjusted under 35 U.S.C. 154(b) by 97 days.

(21) Appl. No.: 17/600,631

(22) PCT Filed: Apr. 7, 2020

(86) PCT No.: PCT/EP2020/059859
§ 371 (c)(1),
(2) Date: Oct. 1, 2021

(87) PCT Pub. No.: WO2020/212196
PCT Pub. Date: Oct. 22, 2020

(65) Prior Publication Data
US 2022/0163896 A1    May 26, 2022

(30) Foreign Application Priority Data

Apr. 16, 2019  (EP) .................................... 19169598

(51) Int. Cl.
*G03F 7/00*   (2006.01)
*C23C 14/34*   (2006.01)
(Continued)

(52) U.S. Cl.
CPC ............ *G03F 7/7085* (2013.01); *C23C 14/34* (2013.01); *C23C 14/5826* (2013.01); *C23C 16/45525* (2013.01); *G03F 7/70341* (2013.01)

(58) Field of Classification Search
CPC ............. G03F 7/70085; G03F 7/70341; C23C 16/45525; C23C 14/5826; C23C 14/34
See application file for complete search history.

(56) References Cited

U.S. PATENT DOCUMENTS

2004/0207824 A1   10/2004   Lof et al.
2005/0041225 A1   2/2005   Sengers et al.
(Continued)

FOREIGN PATENT DOCUMENTS

EP    1420298      5/2004
JP    2010004040   1/2010
(Continued)

OTHER PUBLICATIONS

Office Action dated Nov. 15, 2022, issued in corresponding Japanese Patent Application No. 2021-560966, pp. 1-3.
(Continued)

*Primary Examiner* — Hung V Nguyen
(74) *Attorney, Agent, or Firm* — Pillsbury Winthrop Shaw Pittman, LLP

(57) ABSTRACT

An image sensor for immersion lithography, the image sensor including: a grating; an absorber layer on the grating, the absorber layer configured to absorb radiation; and a liquidphobic coating at an upper surface of the image sensor, wherein a protective layer is provided between the absorber layer and the liquidphobic layer, the protective layer being less reactive than the absorber layer to an immersion liquid.

20 Claims, 4 Drawing Sheets

(51) Int. Cl.
    *C23C 14/58*         (2006.01)
    *C23C 16/455*      (2006.01)

(56) References Cited

U.S. PATENT DOCUMENTS

| | | |
|---|---|---|
| 2005/0175776 A1 | 8/2005 | Streefkerk et al. |
| 2009/0316122 A1 | 12/2009 | Prosyentsov et al. |
| 2013/0001629 A1 | 1/2013 | Chen et al. |
| 2013/0201460 A1 | 8/2013 | Tani |
| 2014/0084421 A1 | 3/2014 | Tseng et al. |

FOREIGN PATENT DOCUMENTS

| | | | | |
|---|---|---|---|---|
| JP | 2011166013 | | 8/2011 | |
| JP | 201325065 | | 2/2013 | |
| JP | 2014216356 | | 11/2014 | |
| WO | 2016093087 | | 6/2016 | |
| WO | 2018114229 | | 6/2018 | |
| WO | WO 2018/144229 | * | 6/2018 | ............... G03F 7/20 |
| WO | 2018166738 | | 9/2018 | |

OTHER PUBLICATIONS

International Search Report and Written Opinion issued in corresponding PCT Patent Application No. PCT/EP2020/059859, dated Jul. 29, 2020.

* cited by examiner

IMAGE SENSOR FOR IMMERSION LITHOGRAPHY

CROSS-REFERENCE TO RELATED APPLICATIONS

This application is the U.S. national phase entry of PCT Patent Application No. PCT/EP2020/059859, which was filed on Apr. 7, 2020, which claims benefit of priority of European Patent Application No. 19169598.0, which was filed on 16 Apr. 2019, and which is incorporated herein in its entirety by reference.

FIELD

The present invention relates to an image sensor for immersion lithography, a substrate table, a lithographic apparatus and a method of making an image sensor.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") of a patterning device (e.g., a mask) onto a layer of radiation-sensitive material (resist) provided on a substrate (e.g., a wafer).

To project a pattern on the substrate the lithographic apparatus may use electromagnetic radiation. The wavelength of this radiation determines the minimum size of features which are patterned on the substrate. Typical wavelengths currently in use are 365 nm (i-line), 248 nm, 193 nm and 13.5 nm. A lithographic apparatus, which uses extreme ultraviolet (EUV) radiation, having a wavelength within a range of 4 nm to 20 nm, for example 6.7 nm or 13.5 nm, may be used to form smaller features on the substrate than a lithographic apparatus which uses, for example, radiation with a wavelength of 193 nm.

In an immersion lithography apparatus, a liquid is confined to an immersion space by a liquid confinement structure. The immersion space is between a final optical element of a projection system through which the pattern is imaged and the substrate onto which the pattern is transferred or a substrate table on which the substrate is held. The liquid may be confined to the immersion space by a fluid seal. The liquid confinement structure may create or use a flow of gas, for example to help in controlling the flow and/or the position of the liquid in the immersion space. The flow of gas may help form the seal to confine the liquid to the immersion space. At least part of the substrate table is coated with a coating with limited hydrophilicity to reduce liquid loss due to motion of the substrate table with respect to the final optical element. At least part of sensors that are integrated into substrate table is coated with a coating with limited hydrophilicity to reduce liquid loss and to reduce heat load by remaining liquid evaporation.

Immersion lithograph apparatus rely on several sensors integrated into the substrate table which supports the substrate. These sensors are used for:
- substrate/substrate table alignment with respect to a reference frame;
- lens (re)adjustment, setup, heating compensation; and
- reticle (mask) heating compensation.

Sensors' marks are integrated into a stack of thin film layers which is deposited on a transparent (quartz) plate built into the substrate table and act as:
- spatial transmission filters for DUV (Integrated Lens Interferometry At Scanner "ILIAS" sensor, Parallel ILIAS sensor (PARIS), Transmission Image Sensor "TIS" sensor functionality).
- spatial reflective filters for Visible Radiation "VIS", Near Infra Red "NIR", Mid-Infra Red "MIR" (Smart Alignment Sensor Hybrid "SMASH" sensor functionality).

The reflection from the top surface of the stack (mark-free region) is used for the level sensor.

Upper layers suffer from degradation, for example due to exposure to deep ultra violet radiation. It can be difficult to prevent a coating or layer from degrading.

Degrading of a coating or layer is undesirable for many reasons including the undesirable generation of particles which can introduce imaging errors if they find their way into a beam path for imaging the substrate or a sensor as well as the fact that the property desired by the presence of the coating or layer is no longer present once the coating or layer has degraded.

SUMMARY

It is desirable, to provide an image sensor for immersion lithography apparatus with an absorber layer which has improved resistance to degradation.

According to an aspect, there is provided an image sensor for immersion lithography, the image sensor comprising: a grating; an absorber layer on the grating, the absorber layer configured to absorb radiation; and a liquidphobic coating at an upper surface of the image sensor; wherein a protective layer is provided between the absorber layer and the liquidphobic layer, the protective layer being less reactive than the absorber layer to an immersion liquid.

According to an aspect, there is provided method of making an image sensor for immersion lithography, the method comprising: providing a grating; depositing an absorber layer on the grating, the absorber layer configured to absorb radiation; depositing a protective layer on the absorber layer, the protective layer being less reactive than the absorber layer to an immersion liquid; and depositing a liquidphobic coating to form an upper surface of the image sensor.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
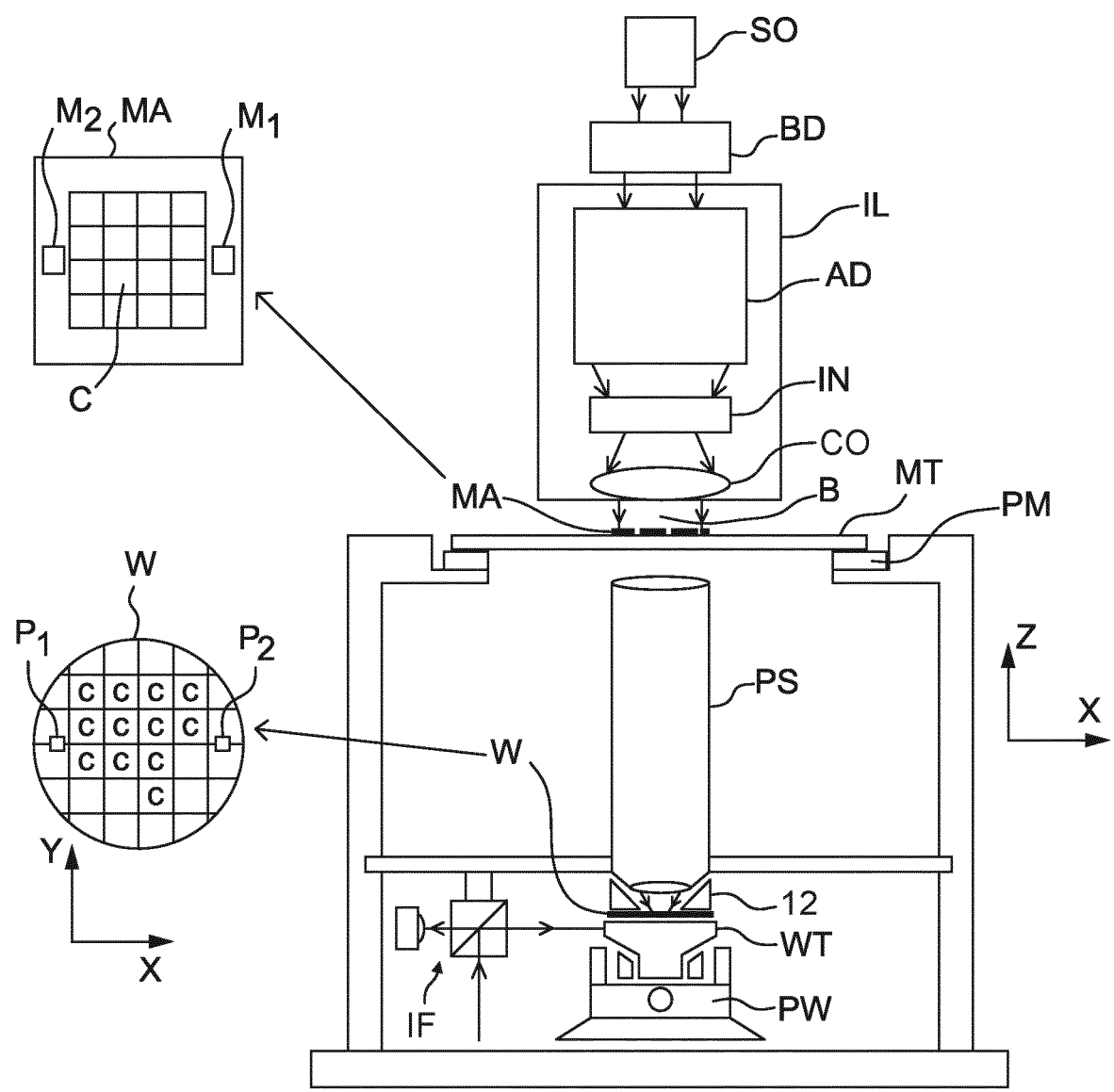
FIG. 1 schematically depicts a lithography apparatus.

FIG. 1 schematically depicts a lithographic apparatus of an embodiment. The apparatus comprises:
- optionally, an illumination system (illuminator) IL configured to condition a radiation beam B (e.g. UV radiation or DUV radiation);
- a support structure (e.g. a mask table) MT constructed to support a patterning device (e.g. a mask) MA and connected to a first positioner PM configured to accurately position the patterning device MA in accordance with certain parameters;
- a support table, e.g. a sensor table to support one or more sensors or a substrate table or wafer table WT constructed to hold a substrate (e.g. a resist-coated production substrate) W, connected to a second positioner PW configured to accurately position the surface of the table, for example of a substrate W, in accordance with certain parameters; and
- a projection system (e.g. a refractive projection lens system) PS configured to project a pattern imparted to the radiation beam B by patterning device MA onto a target portion C (e.g. comprising part of, one, or more dies) of the substrate W.

The lithographic apparatus may be of a type wherein at least a portion of the substrate W may be covered by an immersion liquid having a relatively high refractive index, e.g. water such as ultra pure water (UPW), so as to fill an immersion space between the projection system PS and the substrate W. An immersion liquid may also be applied to other spaces in the lithography apparatus, for example, between the patterning device MA and the projection system PS Immersion techniques can be used to increase the numerical aperture of projection systems. The term "immersion" as used herein does not mean that a structure, such as a substrate W, must be submerged in immersion liquid; rather "immersion" only means that an immersion liquid is located between the projection system PS and the substrate W during exposure. The path of the patterned radiation beam B from the projection system PS to the substrate W is entirely through immersion liquid. In an arrangement for providing immersion liquid between a final optical element of the projection system PS and the substrate W a liquid confinement structure extends along at least a part of a boundary of an immersion space between the final optical element of the projection system PS and the facing surface of the stage or table facing the projection system PS.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illumination system IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system".

The lithographic apparatus may be of a type having two or more support tables, e.g., two or more support tables or a combination of one or more support tables and one or more cleaning, sensor or measurement tables. For example, the lithographic apparatus is a multi-stage apparatus comprising two or more tables located at the exposure side of the projection system, each table comprising and/or holding one or more objects. In an example, one or more of the tables may hold a radiation-sensitive substrate. In an example, one or more of the tables may hold a sensor to measure radiation from the projection system. In an example, the multi-stage apparatus comprises a first table configured to hold a radiation-sensitive substrate (i.e., a support table) and a second table not configured to hold a radiation-sensitive substrate (referred to hereinafter generally, and without limitation, as a measurement, sensor and/or cleaning table). The second table may comprise and/or may hold one or more objects, other than a radiation-sensitive substrate. Such one or more objects may include one or more selected from the following: a sensor to measure radiation from the projection system, one or more alignment marks, and/or a cleaning device (to clean, e.g., the liquid confinement structure).

In operation, the radiation beam B is incident on the pattern (design layout) present on patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder, 2-D encoder or capacitive sensor), the substrate table WT can be moved accurately, e.g. so as to position different target portions C in the path of the radiation beam B at a focused and aligned position. Similarly, the first positioner PM and another position sensor (which is not explicitly depicted in FIG. 1) can be used to accurately position the patterning device MA with respect to the path of the radiation beam B. The patterning device MA and the substrate W may be aligned using patterning device alignment marks $M_1$, $M_2$ and substrate alignment marks $P_1$, $P_2$. Although the substrate alignment marks $P_1$, $P_2$ as illustrated occupy dedicated target portions, they may be located in spaces between target portions C (these are known as scribe-lane alignment marks).

Figure 2:
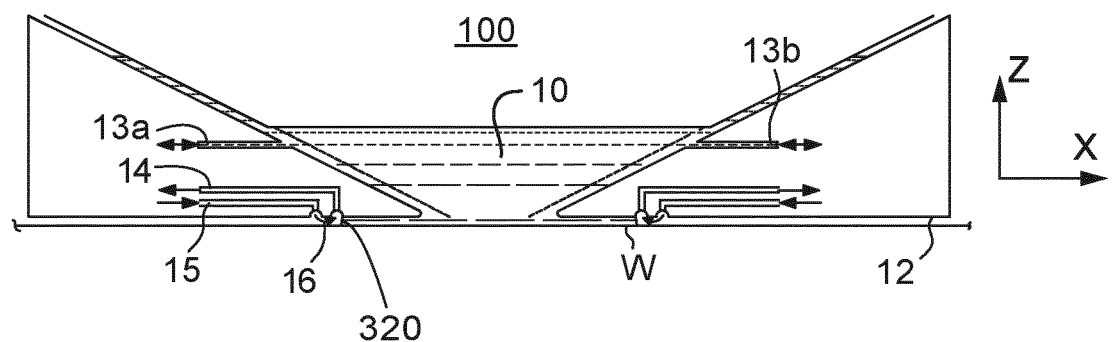
FIG. 2 schematically depicts a liquid confinement structure for use in the lithographic apparatus.

A controller 500 controls the overall operations of the lithographic apparatus and in particular performs an operation process described further below. Controller 500 can be embodied as a suitably-programmed general purpose computer comprising a central processing unit, volatile and non-volatile storage means, one or more input and output devices such as a keyboard and screen, one or more network connections and one or more interfaces to the various parts of the lithographic apparatus. It will be appreciated that a one-to-one relationship between controlling computer and lithographic apparatus is not necessary. One computer can control multiple lithographic apparatuses. Multiple networked computers can be used to control one lithographic apparatus. The controller 500 may also be configured to control one or more associated process devices and substrate handling devices in a lithocell or cluster of which the lithographic apparatus forms a part. The controller 500 can also be configured to be subordinate to a supervisory control system of a lithocell or cluster and/or an overall control system of a fab. In an arrangement which has been proposed for a localized immersion system a liquid confinement structure 12 extends along at least a part of a boundary of an immersion space 10 between the final optical element 100 of the projection system PS and the facing surface of the stage or table facing the projection system PS. The facing surface of the table is referred to as such because the table is moved during use and is rarely stationary. Generally, the facing surface of the table is a surface of a substrate W, substrate table WT, e.g. the substrate table which surrounds the substrate W or both. Such an arrangement is illustrated in FIG. 2. The arrangement illustrated in FIG. 2 and described below may be applied to the lithography apparatus described above and illustrated in FIG. 1.

FIG. 2 schematically depicts the liquid confinement structure 12. The liquid confinement structure 12 extends along at least a part of a boundary of the immersion space 10 between the final optical element 100 of the projection system PS and the substrate table WT or substrate W. In an embodiment, a seal is formed between the liquid confinement structure 12 and the surface of the substrate W/substrate table WT. The seal may be a contactless seal such as a gas seal 16 (such a system with a gas seal is disclosed in European patent application publication no. EP-A-1,420, 298) or a liquid seal.

The liquid confinement structure 12 is configured to supply and confine immersion fluid, e.g., liquid, to the immersion space 10. Immersion fluid is brought into the immersion space 10 through one of liquid openings, e.g., opening 13a. The immersion fluid may be removed through one of liquid openings, e.g., opening 13b. The immersion fluid may be brought into the immersion space 10 through at least two liquid openings, e.g., opening 13a and opening 13b. Which of liquid openings is used to supply immersion fluid and optionally which is used to remove immersion liquid may depend on the direction of motion of the substrate table WT.

Immersion fluid may be contained in the immersion space 10 by the gas seal 16 which, during use, is formed between the bottom of the liquid confinement structure 12 and the facing surface of the table (i.e. the surface of the substrate W and/or the surface of the substrate table WT). The gas in the gas seal 16 is provided under pressure via gas inlet 15 to a gap between the liquid confinement structure 12 and substrate W and/or substrate table WT. The gas is extracted via a channel associated with gas outlet 14. The overpressure on the gas inlet 15, vacuum level on the gas outlet 14 and geometry of the gap are arranged so that there is a high-velocity gas flow inwardly that confines the immersion fluid. The force of the gas on the immersion fluid between the liquid confinement structure 12 and the substrate W and/or substrate table WT contains the immersion fluid in the immersion space 10. A meniscus 320 forms at a boundary of the immersion fluid. Such a system is disclosed in United States patent application publication no. US 2004-0207824. Other liquid confinement structures 12 can be used with embodiments of the present invention.

The present invention will be described below in detail with reference to an image sensor which comprises a substrate of quartz, one or more lower layers for interaction with a beam of radiation and, an outer layer with limited hydrophilicity (sometimes called a liquidphobic coating, a hydrophobic coating or a coating), for example with which water has a receding contact angle of at least 75°, preferably of at least 90°.

Figure 3:
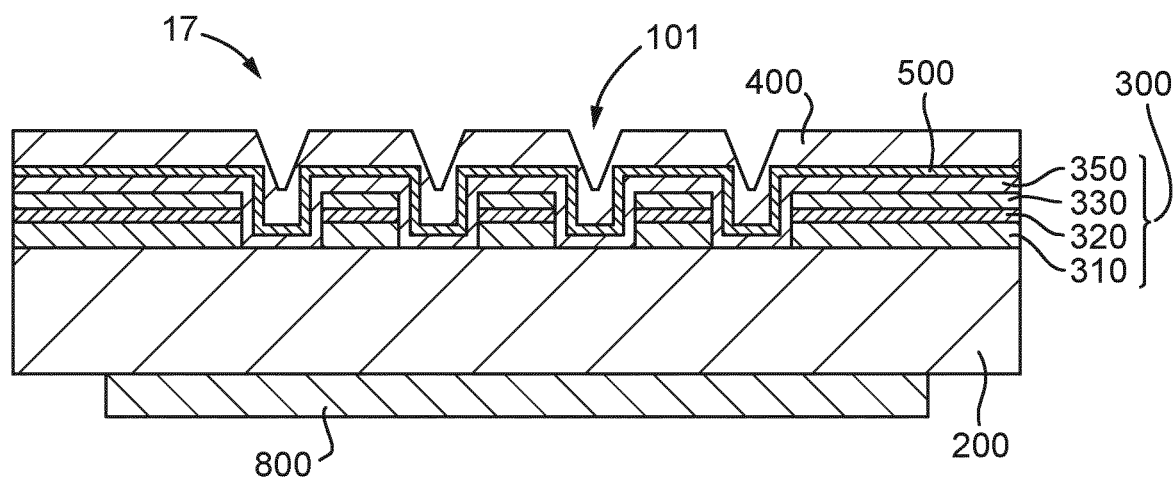
FIG. 3 is a cross-sectional view through an image sensor of the present invention.

FIG. 3 is a cross-sectional view of an image sensor 17 according to the present invention. As shown in FIG. 3, in an embodiment the image sensor 17 comprises a substrate plate 200. In an embodiment, the substrate plate 200 is a quartz ($SiO_2$) plate. The marks of the image sensor 17 are integrated into a stack 300 of thin films which is deposited on top of the substrate plate 200. The substrate plate 200 is integrated into the substrate table WT.

The stack 300 of thin films may comprise any number of layers. As illustrated in FIG. 3, in an embodiment the stack 300 comprises at least four layers. Layers 310, 320 and 330 are layers for absorbing DUV radiation projected onto the image sensor 17 from above, and for absorbing radiation from underneath the substrate plate 200 which might be emitted by a conversion layer 800 under the substrate plate 200. The conversion layer 800 is configured to emit visible light when irradiated by DUV radiation. The layers 310, 320 and 330 form a grating of the image sensor 17.

As shown in FIG. 3, in an embodiment the image sensor 17 comprises an absorber layer 350. The absorber layer 350 is deposited on the grating formed by the layers 310, 320 and 330. In an embodiment, the absorber layer 350 is configured to absorb radiation. In an embodiment, the absorber layer 350 is reflective to VIS, and/or NIR and/or MIR radiation.

In use, the image sensor 17 is configured to pass under the liquid confinement structure 12. When the image sensor 17 passes under the liquid confinement structure 12, the image sensor 17 gets covered in immersion liquid. After the image sensor 17 has passed under the liquid confinement structure 12, it is removed from the immersion liquid.

As shown in FIG. 3, in an embodiment the image sensor 17 comprises a liquidphobic coating 400. The liquidphobic coating 400 is at an upper surface of the image sensor 17. The liquidphobic coating 400 is applied to the image sensor 17 and/or around the image sensor 17 so as to reduce liquid being left behind on the image sensor 17 or on the stack 300.

The purpose of these layers and their manufacture will now be described in more detail following an explanation of the use of the image sensor 17 in a lithographic apparatus. Image sensors act as:

spatial transmission filters for deep ultra violet (DUV) (PARIS, ILIAS, TIS functionality); and spatial reflective filters for VIS, NIR, MIR (SMASH functionality).

Also, the reflection from the top surface of the stack 300 (mark-free region) can be used by other sensors.

As shown in FIG. 3, in an embodiment the image sensor 17 comprises a protective layer 500. The protective layer 500 is provided between the absorber layer 350 and the liquidphobic layer 400. The protective layer 350 is for protecting the absorber layer 350. In an embodiment, the protective layer 500 is less reactive than the absorber layer 350 to the immersion liquid (e.g. water). The protective layer 500 blocks immersion liquid which would otherwise come into contact with the absorber layer 350.

On exposure to DUV radiation, the liquidphobic coating 400 can suffer from shrinkage and degradation. This can lead to holes in the liquidphobic coating 400. Immersion liquid from the liquid confinement structure 12 can come into contact with the layer underneath the liquidphobic coating 400. If the protective layer 500 is not provided, then the immersion liquid can come into contact with the absorber layer 350 through holes in the liquidphobic coating 400. When the immersion liquid contacts the absorber layer 350, the absorber layer 350 can degrade, for example by oxidation.

If the absorber layer 350 undergoes oxidation, then the pattern of the grating formed by the layers 310, 320 and 330 can change. This can result in increased overlay inaccuracy and/or reduced productivity. Additionally, oxidation of the absorber layer 350 can encourage delamination of the liquidphobic coating 400 from the image sensor 17. This can reduce the accuracy of focus in the lithographic apparatus and can reduce the yield of the lithographic process. An embodiment of the invention is expected to achieve an improved overlay performance and/or increased productivity and/or improved focus and/or increased yield.

Figure 7:
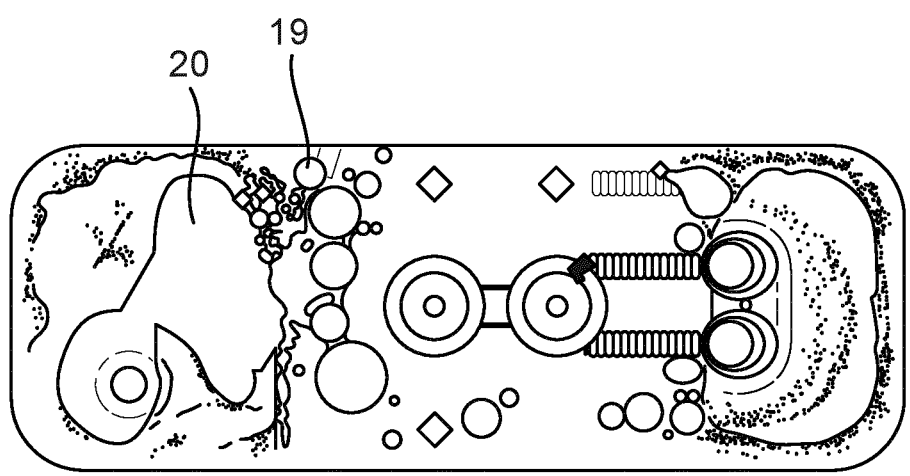
FIG. 7 is a plan image showing degradation of comparative image sensors.

FIG. 7 is a plan view of the comparative image sensor 17. The plan view shown in FIG. 7 reveals a delamination area 20 where the liquidphobic coating 400 has delaminated. This exposes the rest of the stack 300 underneath. FIG. 7 also shows oxidation areas 19, where an oxide of the material used for the absorber layer 350 has formed. An embodiment of the invention is expected to reduce delamination areas 20 and oxidation areas 19 shown in FIG. 7.

In an embodiment, the protective layer 500 is formed of an oxide. By providing that the protective layer 500 is formed of an oxide, the protective layer 500 is less reactive to the immersion liquid. This means that the protective layer 500 is more stable when contacted by the immersion liquid.

In an embodiment, the protective layer 500 is formed of an inorganic material. In an embodiment, the protective layer 500 is formed of $SiO_2$. $SiO_2$ is an inorganic oxide material. Alternatively, the protective layer 500 may be formed of other materials such as aluminium oxide or zirconium oxide.

In an embodiment, the protective layer 500 has optical properties that are similar to the liquidphobic coating 400. This reduces the impact of the protective layer 500 on the optical performance of the image sensor 17. In an embodiment, the protective layer 500 is optically at least semi-transparent. The protective layer 500 may be semi-transparent or transparent.

Figure 4:
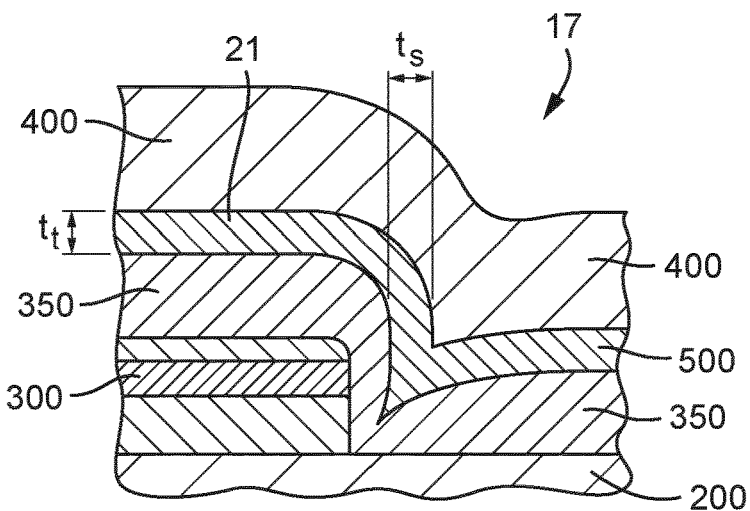
FIG. 4 is an image of part of an image sensor of the present invention.

As shown in FIG. 3, in an embodiment the grating comprises protrusions separated by the holes 101. FIG. 4 is an image of part of an image sensor 17 according to an embodiment of the present invention. As shown in FIG. 4, in an embodiment the protective layer 500 has a first thickness $t_t$ perpendicular to the top of the protrusions. The protective layer 500 has a second thickness $t_s$ perpendicular to the side of the protrusions. In an embodiment, the first thickness $t_t$ is at least half the second thickness $t_s$. In an embodiment, the first thickness $t_t$ as at most twice the second thickness $t_s$. The first thickness $t_t$ and the second thickness $t_s$ are relatively similar to each other. For example, the first thickness $t_t$ may be at most 20%, and optionally at most 10% greater than the second thickness $t_s$. In an embodiment, the first thickness $t_t$ is at least 80%, and optionally at least 90% of the second thickness $t_s$.

This means that the protective layer 500 is substantially conformally coated. This helps to ensure that the edges of the diffraction grating features are covered uniformly.

The protective layer 500 is deposited on the absorber layer 350. In an embodiment, the step of depositing the protective layer 500 comprises using atomic layer deposition (ALD) to form the protective layer 500. This helps the protective layer 500 to have a substantially even thickness along the top and sides of protrusions of the grating formed by the layers 310, 320, and 330. ALD can be used to achieve a highly conformal coating of the protective layer 500 on the absorber layer 350.

In an embodiment, the step of depositing the protective layer 500 further comprises sputtering of further material to form the protective layer 500 onto the atomic layer deposited material. Hence, the process of depositing the protective layer 500 may be a multi-step deposition process. Such a multi-step process can allow the microstructure of the protective layer 500 to be controlled more accurately.

ALD can be used to produce a denser sub-layer closer (e.g. adjacent) to the absorber layer 350. Subsequently, sputtering can be used to produce a more granular sub-layer closer (e.g. adjacent) to the liquidphobic coating 400. The denser sub-layer is configured to provide better protection of the absorber layer 350. The more granular sub-layer is configured to allow better adhesion to the liquidphobic coating 400. This is because a more granular sub-layer has a surface with a greater total surface area (because of the inherent roughness) compared to a denser sub-layer deposited using ALD.

Figure 5:
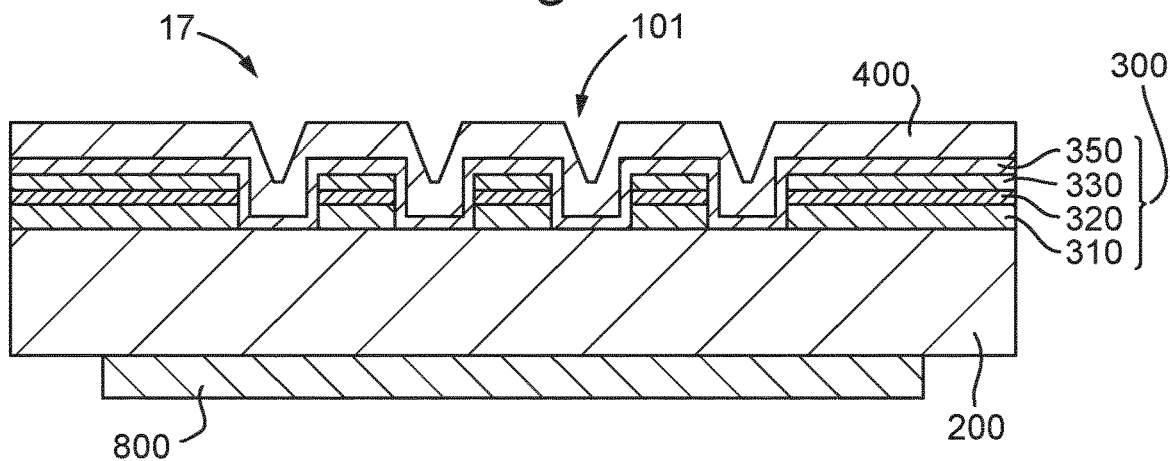
FIG. 5 is a cross-sectional view through a comparative image sensor.

FIG. 5 is a cross-sectional view of a comparative image sensor 17. The comparative image sensor 17 shown in FIG. 5 does not have the protective layer 500 between the liquidphobic coating 400 and the absorber layer 350.

Figure 6:
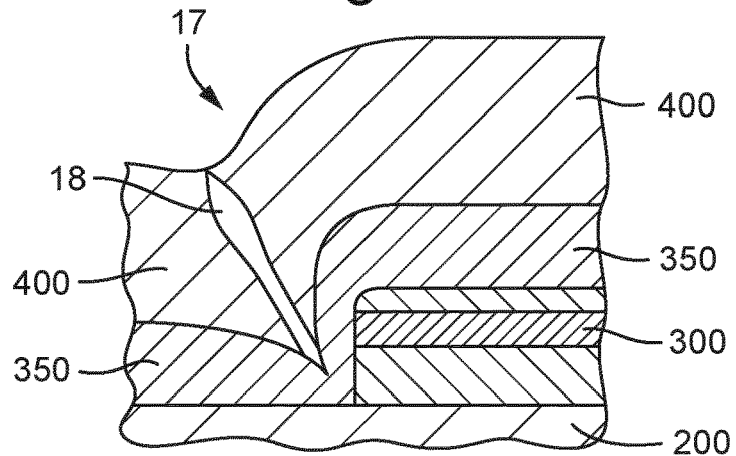
FIG. 6 is a cross-sectional image of part of a comparative image sensor.

FIG. 6 is a microscopy image of part of such a comparative image sensor 17. As shown in FIG. 6, a streak 18 of titanium oxide has formed due to water reaching through the liquidphobic coating 400 and coming into contact with the absorber layer 350. By way of comparison, FIG. 4 shows no titanium oxide formed when the protective layer 500 is provided.

In an embodiment, adhesion strength between the liquidphobic coating 400 and the protective layer 500 is less than adhesion would be between the liquidphobic coating 400 and the absorber layer 350.

In an embodiment, the method of making the image sensor 17 comprises plasma activation of a surface 21 of the protective layer 500 so as to increase adhesion to the liquidphobic coating 400. A reactive ion plasma such as oxygen plasma can be used to treat the surface 21 of the protective layer 500. The treatment can be performed prior to deposition of the liquidphobic coating 400. The plasma activation activates the surface 21 of the protective layer 500, for example by forming radicals on the surface 21. This improves adhesion between the protective layer 500 and the liquidphobic coating 400.

In an embodiment, an adhesion promoter is provided between the protective layer 500 and the liquidphobic coating 400. The adhesion promoter is configured to bridge chemical bonding between the liquidphobic coating 400 and the protective layer 500. Examples of possible adhesion promoters include HMDS and OTS. Other adhesion promoters may also be used.

In an embodiment, the method of making the image sensor 17 comprises bombarding the surface 21 of the protective layer 500 with inert ions so as to increase the roughness of the surface 21. This increases the total surface area of the surface 21, thereby improving adhesion to the liquidphobic coating 400. The surface roughness of the protective layer 500 can be tuned by using non-reactive etching. The surface 21 of the protective layer 500 may have a roughness such that the distance between the peaks and troughs along the surface 21 in the direction perpendicular to the surface 21 is at most 10 nm.

In an embodiment, the step of depositing the liquidphobic coating 400 comprises depositing a more adhesive sub-layer of the liquidphobic coating in a lower pressure environment, and subsequently depositing a less adhesive sub-layer of the liquidphobic coating 400 in a higher pressure environment. The deposition parameters for depositing the liquidphobic coating 400 can be optimised to improve the bonding with the protective layer 500. In an embodiment, the more adhesive sub-layer has a thickness of at most 10 nm. The remainder of the thickness of the liquidphobic coating 400 is formed of the less adhesive sub-layer. By changing the deposition parameters, the liquidphobic coating 400 can be formed so as to transition from being better for adhering to the protective layer 500 to being better for performing the function of reducing liquid left on the image sensor 17.

In an embodiment, the absorber layer 350 is deposited by sputtering. Sputtering can be performed at lower temperatures compared to ALD, for example. Use of a lower temperature helps to protect the image sensor 17 while it is being made.

In an embodiment, the protective layer 500 is amorphous. By providing that the protective layer 500 is amorphous, the protective layer 500 optically interferes less with the image sensor 17. For example, an amorphous layer would not be birefringent.

The image sensor 17 can be mounted on the substrate table WT. The image sensor 17 may be considered as being incorporated into the substrate table WT.

One way to produce the image sensor 17 is described below, with reference to FIG. 3:

1) A continuous layer of Blue Chrome (CrOx-Cr-CrOx) 310, 320, 330, with a total thickness of ~100 nm (e.g. 50-200 nm), is deposited on the quartz substrate plate 200. Blue Chrome 310, 320, 330 is required to minimize secondary reflections of visible light from the conversion layer 800 placed under the substrate plate 200. This conversion layer 800 converts DUV to visible light, which is captured by a sensor. DUV from the projection system PS passes through holes 101 patterned in the Blue Chrome 310, 320, 330. Composition for CrOx is either $Cr_2O_3$, $CrO_xN_y$ or $CrO_xN_yC_z$. The layers within Blue Chrome 310, 320, 330 are: bottom 310 $CrO_x$=10-80 nm thick; middle 320 Cr=5-60 nm thick; and top 330 $CrO_x$=20-100 nm thick.

2) A pattern for PARIS/ILIAS/TIS/SMASH marks (1D and 2D gratings) and other marks are lithographically-deposited and then etched in Blue Chrome 310, 320, 330 until quartz surface is exposed (it acts as etch-stop). Through holes 101 form the pattern.

3) An absorber layer 350 of TiN with total thickness of up to 300 nm or less than 100 nm is deposited (e.g. by sputtering) on top of Blue Chrome 310, 320, 330 and substrate plate 200, it conforms to the pattern. This absorber layer 350 will provide marks for measurements via reflection of VIS/NIR/MIR, without light leaking through quartz (VIS/IR/DUV) through these marks. This layer can be seen as a radiation blocking layer.

4) A protective layer 500 of $SiO_2$ with total thickness of 100 nm is deposited on the absorber layer 350. The first half of the protective layer 500 may be formed by ALD. The second half of the protective layer 500 may be formed by sputtering. This protective layer 500 protects the absorber layer 350 from the immersion liquid.

5) A liquidphobic coating 400 with limited hydrophilicity (e.g. an inorganic polymer with for example a Si—O—Si—O backbone preferably with methyl groups such as Lipocer®) is applied on top of the protective layer 500. Below Lipocer is referred to (but this is not intended to be limiting). For instance, the liquidphobic coating 400 may comprise any inorganic and/or organosilicon polymer. The polymer may have one or more groups selected from: methyl, ethyl, propyl, phenyl, vinyl. Lipocer is deposited on the protective layer 500, which minimizes water loss, during the times the substrate table WT with the image sensor 17 moves from under liquid confinement structure 12. The outer (Lipocer) layer typically has a thickness of 1-300 nm, but can be more, e.g. up to 500 nm.

6) In some spots on the sensor plate, where a high DUV dose is expected due to measurement procedure, Lipocer is not present e.g. removed (typically, a spot is ~100×100 $\mu m^2$ but it may also be larger, e.g. ~2×2 $cm^2$).

Some spots will also be stripped of TiN, so to allow DUV passing to the quartz plate 200 surface through holes 101 in Blue Chrome 310, 320, 330. Such spots are normally over TIS, ILIAS and PARIS (referring to FIG. 3).

Although the invention is described in relation to the outer layer 400 being formed on the absorber layer 350 e.g., TiN, any other nitride with comparable properties can also be used (such as CrN, AlTiN, and TiAlN and ZrN, etc.).

The invention is described above in relation to an image sensor and a liquidphobic layer or a coating with limited hydrophilicity. However, the invention can be applied to other surfaces of a sensor as well as to objects other than a sensor (e.g. lens elements, substrate tables etc.).

Embodiments are provided according to the following clauses:

1. An image sensor for immersion lithography, the image sensor comprising:
   a grating;
   an absorber layer on the grating, the absorber layer configured to absorb radiation; and
   a liquidphobic coating at an upper surface of the image sensor,
   wherein a protective layer is provided between the absorber layer and the liquidphobic layer, the protective layer being less reactive than the absorber layer to an immersion liquid.

2. The image sensor of clause 1, wherein the protective layer is formed of an oxide.

3. The image sensor of clause 1 or 2, wherein the protective layer is formed of an inorganic material.

4. The image sensor of any preceding clause, wherein the protective layer is formed of $SiO_2$.

5. The image sensor of any preceding clause, wherein the protective layer is optically at least semi-transparent.

6. The image sensor of any preceding clause, wherein the grating comprises protrusions, wherein the protective layer has a first thickness perpendicular to a top of the protrusions and a second thickness perpendicular to a side of the protrusions, wherein the first thickness is at least half and at most twice the second thickness.

7. The image sensor of any preceding clause, wherein the protective layer comprises a denser sub-layer closer to the absorber layer and a more granular sub-layer closer to the liquidphobic coating.

8. The image sensor of any preceding clause, comprising an adhesion promoter between the protective layer and the liquidphobic coating.

9. A method of making an image sensor for immersion lithography, the method comprising:
   providing a grating;
   depositing an absorber layer on the grating, the absorber layer configured to absorb radiation;

depositing a protective layer on the absorber layer, the protective layer being less reactive than the absorber layer to an immersion liquid; and depositing a liquidphobic coating to form an upper surface of the image sensor.

10. The method of clause 9, wherein the step of depositing the protective layer comprises using atomic layer deposition to form the protective layer to have a substantially even thickness along the top and sides of protrusions of the grating.

11. The method of clause 10, wherein the step of depositing the protective layer comprises sputtering of further material to form the protective layer onto the atomic layer deposited material.

12. The method of any of clause 9 to 11, comprising plasma activation of a surface of the protective layer so as to increase adhesion to the liquidphobic coating.

13. The method of any of clauses 9 to 12, comprising bombarding a surface of the protective layer with inert ions so as to increase a roughness of the surface.

14. The method of any of clauses 9 to 13, wherein the step of depositing the liquidphobic coating comprises:
   depositing a more adhesive sub-layer of the liquidphobic coating in a lower pressure environment; and
   subsequently depositing a less adhesive sub-layer of the liquidphobic coating in a higher pressure environment.

15. The method of any of clauses 9 to 14, wherein the absorber layer is deposited by sputtering.

16. A substrate table for immersion lithography, the substrate table comprising the image sensor of any of clauses 1 to 8 mounted on it.

17. A lithographic apparatus comprising:
   the substrate table of clause 16;
   a projection system configured to project a pattern from a patterning device onto a substrate held by the substrate table; and
   a liquid supply system configured to provide an immersion liquid to a space between the projection system and the substrate.

Although specific reference may be made in this text to the use of lithography apparatus in the manufacture of ICs, it should be understood that the lithography apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive, reflective, magnetic, electromagnetic and electrostatic optical components.

While specific embodiments have been described above, it will be appreciated that embodiments of the invention may be practiced otherwise than as described. The descriptions above are intended to be illustrative, not limiting. Thus, it will be apparent to one skilled in the art that modifications may be made to the invention as described without departing from the scope of the claims set out below.

The invention claimed is:

1. An image sensor for immersion lithography, the image sensor comprising:
   a grating comprising protrusions;
   an absorber layer on the grating, the absorber layer configured to absorb radiation; and
   a liquidphobic coating at an upper surface of the image sensor;
   a protective layer between the absorber layer and the liquidphobic layer, the protective layer being less reactive than the absorber layer to an immersion liquid, and
   wherein the protective layer has a first thickness perpendicular to a top of the protrusions and a second thickness perpendicular to a side of the protrusions, the first thickness being at least half and at most twice the second thickness.

2. The image sensor of claim 1, wherein the protective layer is formed of an oxide.

3. The image sensor of claim 1, wherein the protective layer is formed of an inorganic material.

4. The image sensor of claim 1, wherein the protective layer is formed of $SiO_2$.

5. The image sensor of claim 1, wherein the protective layer is optically at least semi-transparent.

6. The image sensor of claim 1, wherein the protective layer comprises a denser sub-layer closer to the absorber layer and a more granular sub-layer closer to the liquidphobic coating.

7. The image sensor of claim 1, further comprising an adhesion promoter between the protective layer and the liquidphobic coating.

8. A substrate table for immersion lithography, the substrate table comprising the image sensor of claim 1 mounted on it.

9. A lithographic apparatus comprising:
   the substrate table of claim 8;
   a projection system configured to project a pattern from a patterning device onto a substrate held by the substrate table; and
   a liquid supply system configured to provide an immersion liquid to a space between the projection system and the substrate.

10. An image sensor for immersion lithography, the image sensor comprising:
    a grating;
    an absorber layer on the grating, the absorber layer configured to absorb radiation; and
    a liquidphobic coating at an upper surface of the image sensor;
    a protective layer between the absorber layer and the liquidphobic layer, the protective layer being less reactive than the absorber layer to an immersion liquid and the protective layer comprising a denser sub-layer closer to the absorber layer and a more granular sub-layer closer to the liquidphobic coating.

11. The image sensor of claim 10, wherein the protective layer is formed of an oxide.

12. The image sensor of claim 10, wherein the protective layer is formed of an inorganic material.

13. The image sensor of claim 10, further comprising an adhesion promoter between the protective layer and the liquidphobic coating.

14. A substrate table for immersion lithography, the substrate table comprising the image sensor of claim 10 mounted on it.

15. A lithographic apparatus comprising:
the substrate table of claim 14;
a projection system configured to project a pattern from a patterning device onto a substrate held by the substrate table; and
a liquid supply system configured to provide an immersion liquid to a space between the projection system and the substrate.

16. An image sensor for immersion lithography, the image sensor comprising:
a grating;
an absorber layer on the grating, the absorber layer configured to absorb radiation; and
a liquidphobic coating at an upper surface of the image sensor;
a protective layer between the absorber layer and the liquidphobic layer, the protective layer being less reactive than the absorber layer to an immersion liquid,
wherein there is an adhesion promoter between the protective layer and the liquidphobic coating and/or the liquidphobic coating comprises a more adhesive sub-layer of the liquidphobic coating closer to the protective layer and a less adhesive sub-layer of the liquidphobic coating further away from the protective layer.

17. The image sensor of claim 16, comprising the more adhesive sub-layer of the liquidphobic coating closer to the protective layer and the less adhesive sub-layer of the liquidphobic coating further away from the protective layer.

18. The image sensor of claim 16, wherein the grating comprises protrusions and wherein the protective layer has a first thickness perpendicular to a top of the protrusions and a second thickness perpendicular to a side of the protrusions, wherein the first thickness is at least half and at most twice the second thickness.

19. A substrate table for immersion lithography, the substrate table comprising the image sensor of claim 16 mounted on it.

20. A lithographic apparatus comprising:
the substrate table of claim 19;
a projection system configured to project a pattern from a patterning device onto a substrate held by the substrate table; and
a liquid supply system configured to provide an immersion liquid to a space between the projection system and the substrate.

* * * * *